United States Patent [19]

Bruchmann et al.

[11] Patent Number: 4,897,764
[45] Date of Patent: Jan. 30, 1990

[54] CONDUCTIVE COOLING CUP MODULE

[75] Inventors: Richard A. Bruchmann, Blaine; Richard B. Salmonson, Circle Pines, both of Md.

[73] Assignee: Control Data Corporation, Minneapolis, Minn.

[21] Appl. No.: 265,208

[22] Filed: Oct. 31, 1988

[51] Int. Cl.$^4$ .............................................. H01L 23/36
[52] U.S. Cl. .................................................... 361/387
[58] Field of Search ................................ 361/386, 387

[56] References Cited

U.S. PATENT DOCUMENTS 4,639,829 1/1987 Ostergren et al. .................. 361/386

Primary Examiner—Roy N. Envall, Jr.
Attorney, Agent, or Firm—Frederick W. Niebuhr; Robert M. Angus; Richard E. Billion

[57] ABSTRACT

A metal heat spreading cup, hereinafter referred to as a "conductive cup module" ("CCM"), is utilized as part of the interface between at least one semiconductor being cooled and a pedestal, sometimes referred to as a "boss", coupled to a cooling medium. The semiconductor being cooled is, according to one embodiment of the invention, bonded to the underside of the cup. Furthermore, according to the invention, the pedestal is inserted into the cup and is bonded thereto by use of a deformable thermal conductive compound, (such as a thermal paste or grease) also inserted into and contained within the cup. The compound spreads upon being displaced by the inserted pedestal. The compound remains deformable during operation of the cooling system. After the pedestal is inserted and the compound is displaced, the inside bottom and sides of the cup (without overfilling) are lined with the compound and a thermal contact between the cup and the pedestal is achieved on all surfaces of the pedestal inserted into the compound. The cup and pedestal are separated from each other by the thermal compound and therefore electrical isolation of these components is achieved. The result is a cooling system wherein (1) the CCM acts as both a heat spreader and containment cup; (2) electrical isolation between a given semiconductor and the heat sink is performed; and (3) inherent thermal expansion compensation is achieved by virtue of the deformable (paste like) layer between the cup and pedestal.

18 Claims, 4 Drawing Sheets

CONDUCTIVE COOLING CUP MODULE

BACKGROUND OF THE INVENTION

1. Field of the Invention

The present invention relates generally to methods and apparatus for dissipating the heat generated by high speed computer chips. More particularly, the invention relates to improved methods and apparatus for dissipating the heat generated by such semiconductors (bare die or chip) through the use of a heat path from the semiconductor to a heat exchanger, wherein the path includes a conductive cooling cup module. The improved methods and apparatus maximize the thermal conductance and heat spreading ability of the heat path, provide electrical isolation for the semiconductor and compensate for the coefficients of thermal expansion of the components in the disclosed heat transfer and dissipation system.

2. Description of the Related Art

High speed computer chips that are used to support present day chip onboard technology emit a great deal of heat. The prior art is replete with heat exchange methods and apparatus that are useful in performing the needed cooling function for such chips.

But a few examples of the variety of cooling and heat transfer mechanisims used in conjunction with semiconductors are those taught in patents to Spaight, U.S. Pat. No. 4,092,697, issued May 30, 1978; Wessely, U.S. Pat. No. 4,517,624, issued May 14, 1985; Wakalayashi et al, U.S. Pat. No. 4,535,384, issued Aug. 13, 1985; Kaufman, U.S. Pat. Nos. 4,546,410 and 4,546,411, issued Oct. 5, 1985; Kirby, U.S. Pat. No. 4,563,725, issued Jan. 7, 1986; and Nilsson, U.S. Pat. No. 4,573,103, issued Feb. 25, 1986.

Designs using thermal compounds (in a variety of ways), pressure (to push packages against cold plates) with resilient material buffers, specially designed heat sinks attached to chips, cooling fins, etc., are all shown in the above referenced patents and form a background for the present invention.

U.S. Pat. No. 4,546,409, issued on Oct. 8, 1985 to Yoshino et al; IBM, in an article by S. Oktay, B. Dessauer and J. L. Horvath, entitled "New Internal and External Cooling Enhancements for the IBM 4381 Module", published by the IBM General Technology Division, East Fishkill, Hopewell Junction, N.Y., 12533; and Mitsubishi Electric Corp., in an article by M. Kohara, S. Nakao, K. Tsuutsumi, H. Shibita, and H. Nakata, entitled "High Thermal Conduction Module", published by the IEEE in 1985, also show specific techniques for performing the aforesaid cooling function. These techniques will be described in more detail since the present invention will be shown to make distinct improvements over these techniques per se.

Yoshino teaches a device for cooling semiconductor elements constituted by an aluminum (or aluminum alloy) cooling plate and a semiconductor element-mounting sheet (made of aluminum or aluminum alloy) where the sheet has on one surface a metal layer to which solder can be applied and the other surface of the sheet is secured, by ultrasonic welding, to a recessed protion of the cooling plate. The Yoshino patent specifically depicts a cup type device that is used as an interface between a diode and the aluminum cooling plate.

In fact, the Yoshino "cup" does not act as a container for thermal compound during operation. The compound is rigidly soldered to the cup and the semiconductor being cooled is rigidly implanted in the solder. The rigidity in the Yoshino system does not allow for different thermal coefficients in the thermal path between the cold plate, heat spreader and the semiconductor. Those skilled in the art will readily appreciate that it would be desirable to overcome this shortcoming of the Yoshino cooling system.

The IBM reference teaches air cooling the chips for its 4381 computer by providing a specially fabricated thermopaste to couple the bare chip to a pedestal which is connected to a heat exchanger. The IBM system has no heat spreading capability which unduly limits the surface area over which heat is transferred. This has a negative effect on the cooling systems ability to conduct heat.

The Mitsubishi reference teaches cementing a copper plate to the bare chip which spreads the heat over a wider area. The copper plate is spaced from the heat exchanger to maintain electrical isolation and heat is conducted across the gap between the two by hydrogen gas. A high degree of manufacturing tolerance is required to provide a reliably small gap.

The lack of heat spreading capability in the IBM teaching and the manufacturing tolerances required in the Mitsubishi teaching further typify shortcomings in the known art.

It would be desirable if a departure from the known art were achieved wherein the thermal conductance from a semiconductor (bare die or chip) to a heat exchanger could be maximized, electrical isolation of the semiconductor could be maintained without negatively impacting manufacturing tolerances of the cooling system and the problems associated with mismatches in coefficients of thermal expansion could be avoided.

Achieving these objectives and placing a greater emphasis on thermal management generally becomes even more important when a bare die (no package) is placed directly on a printed circuit board. As denser packing schemes evolve and power requirements rise, the need for effective cooling design and thermal management increases.

SUMMARY OF THE INVENTION

Accordingly, it is an object of the invention to provide methods and apparatus which can be used to more effectively manage the thermal energy generated by semiconductor elements then is currently possible using known cooling and heat transfer techniques.

More particularly, it is an object of the invention to provide methods and apparatus that maximize thermal conductance from a semiconductor to a heat exchanger while at the same time providing electrical isolation for the semiconductor.

It is a further object of the invention to realize the aforesaid objectives without negatively impacting manufacturing tolerances of the cooling system while solving the problems associated with mismatches in coefficents of thermal expansion of the system's components.

According to the invention, a metal heat spreading cup, hereinafter referred to as a "conductive cup module" ("CCM"), is utilized as part of the interface between at least one semiconductor being cooled and a pedestal, sometimes referred to as a "boss", coupled to a cooling medium. The semiconductor being cooled is, according to one embodiment of the invention, bonded to the underside of the cup.

Furthermore, according to the invention, the pedestal is inserted into the cup and is bonded thereto by use of a deformable thermal conductive compound (such as a thermopaste or grease) also inserted into and contained within the cup. The compound spreads upon being displaced by the inserted pedestal. The compound remains deformable during operation of the cooling system.

Finally, according to a preferred embodiment of the invention, after the pedestal is inserted and the compound is displaced, the inside bottom and sides of the cup (without overfilling) are lined with the compound and a thermal contact between the cup and the pedestal is achieved on all surfaces of the pedestal inserted into the compound. Since the cup and the pedestal are not in direct contact with each other, the compound acts as an electrical insulator.

The result is a cooling system that achieves the aforestated objectives. More particularly, (1) the CCM acting as both a heat spreader and containment cup; (2) electrical isolation between a given semiconductor element and the heat sink is attached; and (3) inherent thermal expansion compensation is performed by virtue of the deformation characteristics of the paste like compound between the cup and pedestal.

These and other objects and features will be recognized by those skilled in the art upon reviewing the detailed description set forth hereinafter in conjunction with the Drawing.

DETAILED DESCRIPTION

Figure 1:
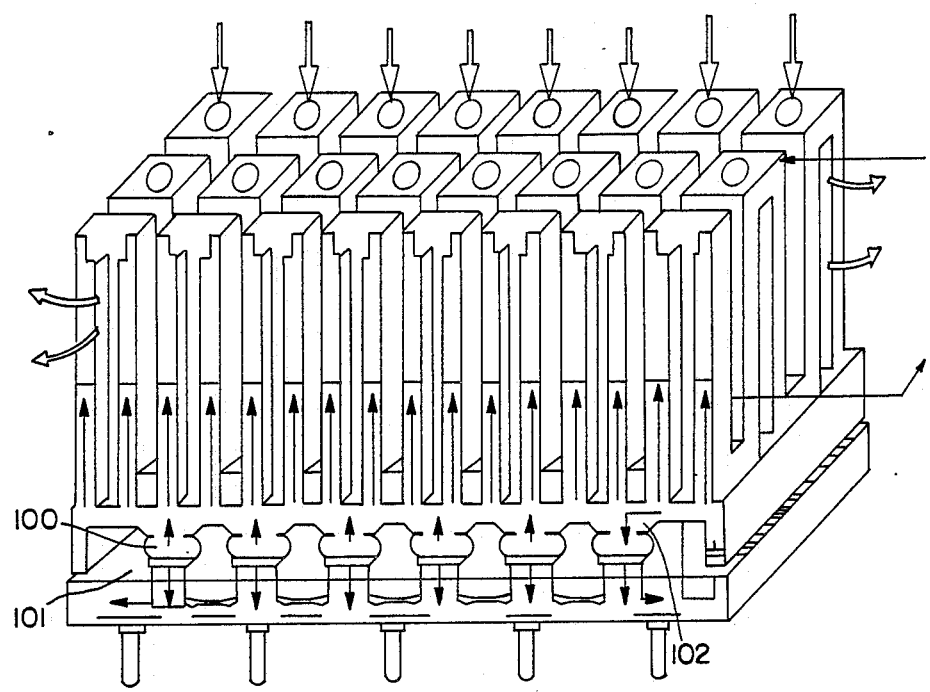
FIG. 1 depicts the prior art cooling system taught by the aforementioned IBM reference in connection with the IBM 4381.

FIG. 1 depicts the prior art cooling system described in the IBM reference referred to hereinbefore. In FIG. 1, thermal paste 100 is shown being utilized to connect bare chip 101 to pedestal 102 of ceramic cap 103. As indicated hereinbefore, IBM's use of a thermal compound (paste 100) as the sole interface between chip 101 and pedestal 102, fails to provide a heat spreading capability in their cooling system.

As will be shown hereinafter the system taught herein utilizes the CCM for three dimensional heat spreading, thereby providing a surface area across which heat is transferred that is 3-4 times greater than the IBM unidimensional approach. This larger area allows for reduced thermal resistance, and therefore better thermal performance, while the cup shape itself will be seen to contain a deformable thermal compound and prevent its undesirable spreading or spillage during system operation.

Figure 2:
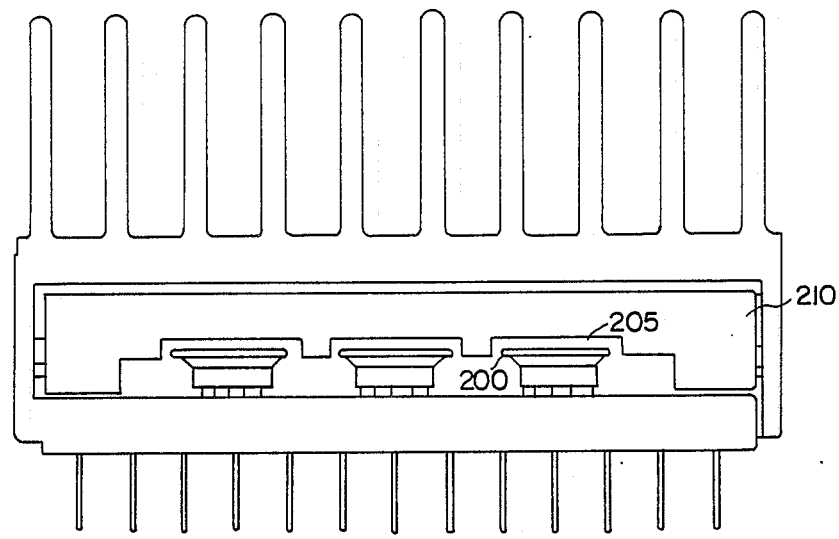
FIG. 2 depicts the prior art cooling system taught by the aforementioned Mitsubishi reference.

FIG. 2 depicts the prior art cooling system described in the Mitsubishi reference referred to hereinbefore. In FIG. 2, copper plate 200 acts as a heat spreader. However, a gap, 205, between copper plate 200 and ceramic cap 210 is also shown. The Mitsubushi design relies on this extremely small gap between the heat spreader and the heat sink in order to operate properly.

This gap is in the 0.001 inch range. Heat transfer across the gap is dependent on hydrogen gas located therein. The thermal resistance varies dramatically with very small changes in the gap. The size of the gap is therefore critical and tolerances must be tightly controlled. Any misalignments in the heat path components and the effects of thermal expansion in general, will effect gap size and in turn impact the heat transfer ability of the Mitsubishi system.

Figure 3:
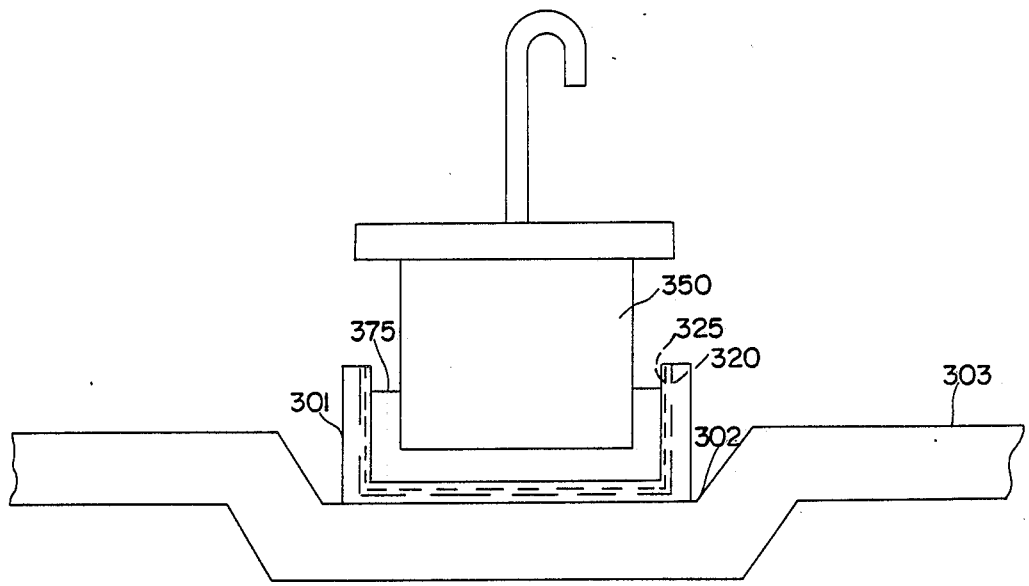
FIG. 3 depicts the cooling system taught by the aforementioned Yoshino reference in U.S. Pat. No. 4,546,409.

FIG. 3 depicts the cooling system described in the Yoshino patent referred to hereinbefore. In FIG. 3, a "cup" shaped semiconductor element mounting case 301 is shown provided in mounting recess 302 of cooling plate 303.

Yoshino's case 301 consists of an aluminum plate having on one surface thereof a copper layer 320 formed by copperizing. Further, a preformed solder layer 325 is formed on the outer side of the copper layer. Reference numeral 350 denotes a diode semiconductor element which is secured by solder, 375, onto semiconductor element mounting case 301.

As pointed out hereinbefore, cup 301 acts only as a heat spreader and not as a containment cup during operation. The semiconductor device, 350, is rigidly attached to cup 301 via solder 375. As a result the Yoshino system does not allow for differences in the thermal coefficient of expansion between the heat spreader and the semiconductor.

Figure 4:
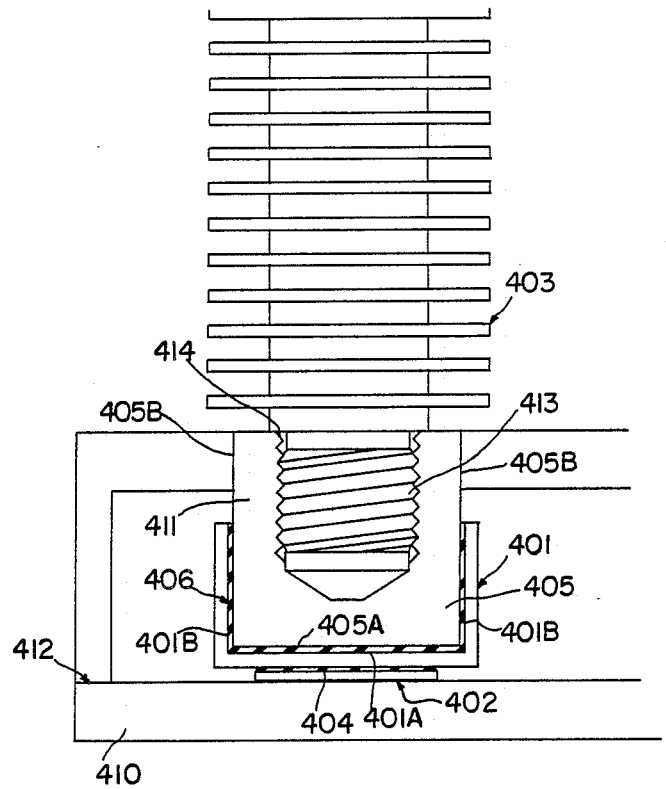
FIG. 4 depicts a cooling system that incorporates the CCM and is built in accordance with the teachings of the invention.

Reference is now made to FIG. 4 which depicts the novel cooling system.

A highly conductive cup heat spreader 401, having a flat and horizontal inner bottom surface 401A and planar upright inner side surfaces 401B, is shown as an integral part of the heat path from bare die (or alternatively a chip) 402, to heat sink/cooling medium 403. According to the preferred embodiment of the invention, conductive cup 401 is made of a copper base material. Other highly thermal conductive materials may be substituted without departing from the scope or spirit of the invention.

Heat generated by die 402 is conducted through the die to conductive cup 401. Conductive cup 401 is shown bonded to the back of die 402 via thermal epoxy 404. Commercially available epoxy, such as "Able Stick", may be used to perform the bonding.

With further reference to FIG. 4 it can be seen that the heat from die 402 is subsequently conducted to a highly conductive boss 405 having a flat bottom exterior surface 405A and planar exterior side surfaces 405B, via a thin layer of thermal compound 406. Heat is carried through boss 405 to the heat sink and removed by the cooling medium. Substrate 410 and a cap 411 (sealed to the substrate at 412) are also depicted in FIG. 4 for the sake of completeness. They form no part of the heat path per se. Heat sink 403 is coupled to boss 405 by an externally threaded bottom portion 413 and an internally threaded bore 414 in the boss.

According to the invention, conductive cup 401 has a dual purpose. First, the cup will contain the thermal compound. Secondly, the cup acts as a heat spreader by increasing the surface across which heat is transferred.

Initially, a predetermined amount of thermal compound is dispensed into the cup. According to an illustrative embodiment of the invention a thermal compound such as AAVID's "Therm-O-Link 1000" may be used. Those skilled in the art will recognize that the invention is not intended to be limited by the type of thermal compound so long as it remains deformable during the operation of the cooling system. By way of example, commercially available thermal grease may be used instead of a thermal paste.

According to the preferred embodiment of the invention, after the thermal compound is inserted into the cup the boss is lowered into the compound forcing it to spread across the bottom surface 405A and up the side surfaces 405B of the boss. I.e., the compound lines the interior of the cup (without overfilling it) and fills a gap between the cup and the boss. Once the cooling system is assembled, this thin layer of thermal compound provides an interface between the interior cup surfaces 401A and 401B and the surfaces 405A and 405B of the boss inserted into the cup. All of these surfaces thus become available for heat transfer. It should be noted that according to the invention the cup and boss do not come in contact with one another. The thermal compound provides the desired electrical isolation referred to in the objectives.

Furthermore, according to the invention, the deformable thermal compound layer absorbs possible tolerance build ups in the components of the heat transfer system.

Major features and components of the system depicted in FIG. 4 are:
1. The dual function containment cup/heat spreader;
2. The electrical isolation of the die from the cooling medium;
3. The thin deformable layer of thermal compound for absorbing tolerance build-ups, allowing for a more forgiving design;
4. Accessibility to the cooling hardware (it can be separated from the base at the thermal compound interface);
5. Reduced stress on the die because the external cooling hardware is not directly attached to the die (even though a continuous thermal path is achieved); and
6. The cooling scheme can be attached to any type of cooling medium (the air cooled system depicted in FIG. 4 having been chosen for the sake of illustration only).

In summary, the invention solves the problems that exist in the prior art teachings referred to hereinbefore. The invention improves on the IBM 4381 design shown in FIG. 1 by adding the metal, heat-spreading cup between the chip and the pedestal. The cup acts as a heat spreader similar to the Mitsubishi copper plate, 200, shown in FIG. 2; but manufacturing tolerances are on the order of ten-times more forgiving because the cup/pedestal interface is achieved by using the deformable, paste like, off-the-shelf thermal compound. As for the Yoshino reference, the invention set forth herein offers distinct advantages with respect to manufacturing tolerances, reduced stress, etc.

The foregoing description of a preferred embodiment of the novel methods and apparatus for achieving the objects of the invention has been presented for purposes of illustration and description only. It is not intended to be exhaustive or to limit the invention to the precise form disclosed, and obviously many modifications and variations are possible in light of the above teaching.

The embodiment and examples set forth herein were presented in order to best explain the principles of the instant invention and its practical application to thereby enable others skilled in the art to best utilize the instant invention in various embodimetns and with various modifications as are suited to the particular use contemplated.

It is intended that the scope of the instant invention be defined by the claims appended hereto.

What is claimed is:
1. Apparatus for cooling at least one semiconductor element comprising:
   (a) a heat sink;
   (b) a thermally conductive compound means which has the property that it is deformable while conducting thermal energy;
   (c) a substantially rigid and conductive cup means having an inner bottom surface and an inner side surface means extended from the inner bottom surface for containing a predetermined amount of said compound means, wherein said cup means is further operative as a heat spreader;
   (d) a thermally conductive bonding means for bonding said cup means to a given semiconductor; and
   (e) a substantially rigid boss means having an exterior bottom surface and an exterior side surface means extended from the exterior bottom surface, inserted into said compound means with said inner and exterior bottom surfaces facing one another and with said inner and exterior side surface means facing one another and with the compound means along and between the bottom and side surfaces, for providing a thermal path between said compound means and said heat sink, whereby the combination of said bonding means, said cup means, said compound means and said boss means, forms a continuous heat path between the semiconductor element and said heat sink.

2. Apparatus as set forth in claim 1 wherein said cup means is metal.

3. Apparatus as set forth in claim 2 wherein said metal is a copper base material.

4. Apparatus as set forth in claim 1 wherein said compound means is a thermal paste.

5. Apparatus as set forth in claim 1 wherein said compound means is a thermal grease.

6. Apparatus as set forth in claim 1 wherein said bonding means is an epoxy.

7. Apparatus as set forth in claim 1 wherein said predetermined amount of said compound means is chosen so that the maximum surface area thermal interface between said cup means and said boss means is achieved while avoiding the possiblity of spillage of said compound means over the lip of said cup means.

8. Apparatus as set forth in claim 1 wherein said heat sink is air cooled.

9. Apparatus as set forth in claim 1 wherein each semiconductor being cooled is electrically isolated form said heat sink.

10. Apparatus as set forth in claim 1 which inherently compensates for any mismatch in the thermal coefficient of expansion of the components in said continuous heat path.

11. A combined semiconductor element and cooling device therefore, comprising:
   (a) a heat sink;
   (b) a thermally conductive compound means which has the property that it is deformable while conducting thermal energy;
   (c) a substantially rigid and conductive cup means having an inner bottom surface and an inner side surface means extended from the inner bottom surface for containing a predetermined amount of said compound means, wherein said cup means is further operative as a heat spreader;

(d) a thermally conductive bonding means for bonding said cup means to a semiconductor element;

(e) a semiconductor element, bonded to said cup means via said bonding means; and (f) a substantially rigid boss means having an exterior bottom surface and an exterior side surface means extended from the exterior bottom surface, inserted into said compound means with said inner and exterior bottom surfaces facing one another and with said inner and exterior side surface means facing one another, for providing a thermal path between said compound means and said heat sink, whereby the combination of said semiconductor element, said bonding means, said cup means, said compound means and said boss means, forms a continuous heat path between said semiconductor element and said heat sink.

12. A method for cooling at least one semiconductor element, comprising the steps of:

(a) bonding a given semiconductor element to a substantially rigid and conductive heat spreading cup means having an inner bottom surface and an inner side surface means extended from the inner bottom surface;

(b) inserting, into said cup means, a predetermined amount of thermal compound which has the property that it is deformable during the cooling operation; and (c) inserting, into said compound contained in said cup means, a pedestal having an exterior bottom surface and an exterior side surface means extended from the exterior bottom surface, and with said inner and exterior bottom surfaces facing one another and with said inner and exterior side surface means facing one another, said pedestal in turn being, coupled to a heat sink, so that an electrically insulated thermal contact is established between said cup means and said pedestal via said compound.

13. A method as set forth in claim 12 further comprising the step of electrically isolating each semiconductor from said heat sink.

14. A method as set forth in claim 13 further comprising the step of compensating for the thermal coefficient of expansion of the components in the heat path between a given semiconductor element and said heat sink, by floating said pedestal in said compound during the cooling operation.

15. An apparatus for thermally coupling a semiconductor element and a heat sink, including:

a semiconductor element;

a thermally conductive and deformable compound means;

a substantially rigid and thermally conductive cup means having an inner bottom surface and an inner side surface means extended away from said inner bottom surface, for containing a predetermined amount of said thermally conductive compound means within said cup;

a substantially rigid pedestal means having an exterior bottom surface and an exterior side surface means extended away from the exterior bottom surface, said pedestal means inserted into the cup means with said thermally conductive compound means disposed along and between said inner bottom surface and exterior bottom surface, and along and between said inner side surface means and said exterior side surface means, to form a continuous thermally conductive interface between said cup and said pedestal;

a heat sink; and a first coupling means for joining said cup to one of said semiconductor and heat sink, and a second coupling means for joining said pedestal to the other of said semiconductor and heat sink.

16. The apparatus of claim 15 wherein:

said first coupling means joins said semiconductor element to said cup at an exterior surface thereof parallel to said inner bottom surface, said inner side surface means extends in a direction away from said semiconductor element, and said second coupling means joins said pedestal to said heat sink.

17. The apparatus of claim 16 wherein:

said inner bottom surface is substantially planar, and said inner side surface means is substantially perpendicular to said bottom surface.

18. The apparatus of claim 16 wherein:

said first coupling means comprises a thermally conductive epoxy, and said second coupling means comprises means forming a bore into said pedestal means having internal threads, and conforming external threads formed on a portion of said heat sink.

* * * * *

UNITED STATES PATENT AND TRADEMARK OFFICE
CERTIFICATE OF CORRECTION

PATENT NO. : 4,897,764

DATED : January 30, 1990

INVENTOR(S) : Richard A. Bruchmann/Richard B. Salmonson

It is certified that error appears in the above-identified patent and that said Letters Patent is hereby corrected as shown below:

Column 7, line 45, patent Claim 14, change the dependency from "13" to -- 12 --.

Signed and Sealed this

Eighteenth Day of December, 1990

*Attest:*

HARRY F. MANBECK, JR.

*Attesting Officer*      *Commissioner of Patents and Trademarks*